United States Patent [19]

Seidler

[11] Patent Number: 4,802,862
[45] Date of Patent: Feb. 7, 1989

[54] SOLDERABLE ELECTRICAL CONTACT

[75] Inventor: Jack Seidler, Flushing, N.Y.

[73] Assignee: North American Specialties Corporation, Flushing, N.Y.

[21] Appl. No.: 538,851

[22] Filed: Oct. 6, 1983

Related U.S. Application Data

[63] Continuation of Ser. No. 248,800, Mar. 30, 1981, abandoned.

[51] Int. Cl.[4] .............................................. H01R 9/09
[52] U.S. Cl. .................................... 439/83; 439/876
[58] Field of Search ................ 339/17 C, 217 R, 218, 339/275

[56] References Cited

U.S. PATENT DOCUMENTS

| | | | |
|---|---|---|---|
| 3,780,433 | 12/1973 | Lynch | 339/17 C X |
| 4,076,356 | 2/1978 | Tamburro | 339/17 C |
| 4,181,385 | 1/1980 | DeSantis et al. | 339/17 C |

Primary Examiner—Joseph H. McGlynn
Attorney, Agent, or Firm—Darby & Darby

[57] ABSTRACT

A component and method are provided for making a soldered electrical connection between two mating members, in which a deposit of solder on the surface of one of the members is juxtaposed to a cooperatively shaped surface on the other member when the two members are mated, so that the solder will melt and bind the two surfaces when heated. The quality of this connection may be further improved by providing a resilient arrangement for urging the conforming surfaces together as heat is applied. In one form of contact element according to the invention a hollow, cylindrical metal shell with a longitudinal split provides a resilient fit into a mating member, such as a metal-lined hole on a printed circuit board. The shell is provided with a deposit of solder in a groove on its outer surface where the shell is to engage the metal lining of the hole.

2 Claims, 3 Drawing Sheets

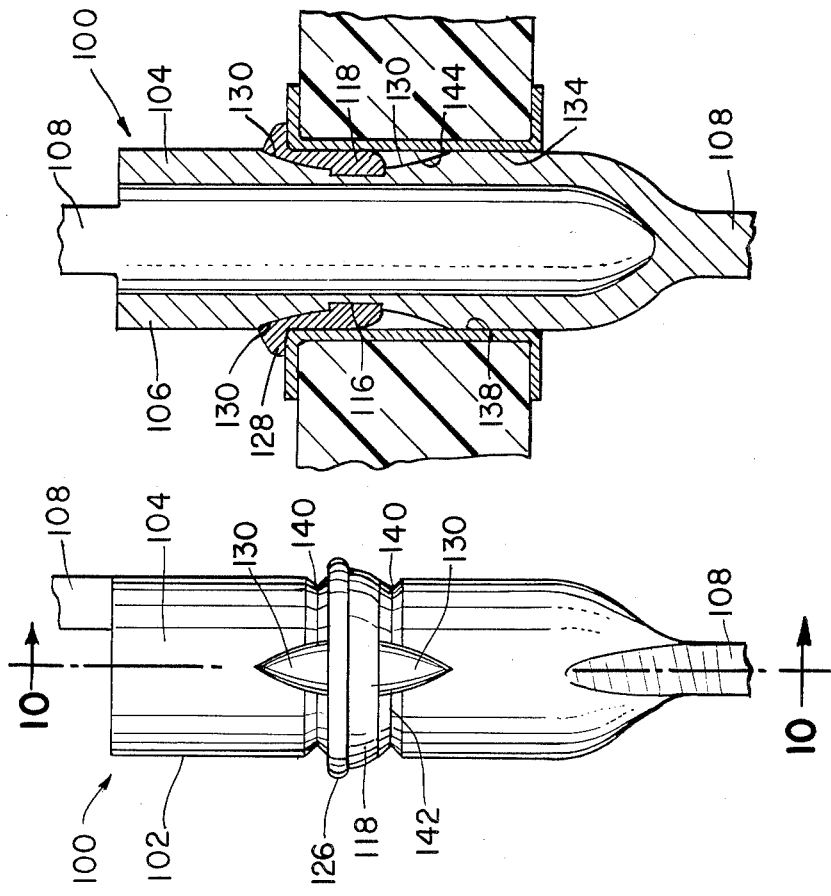
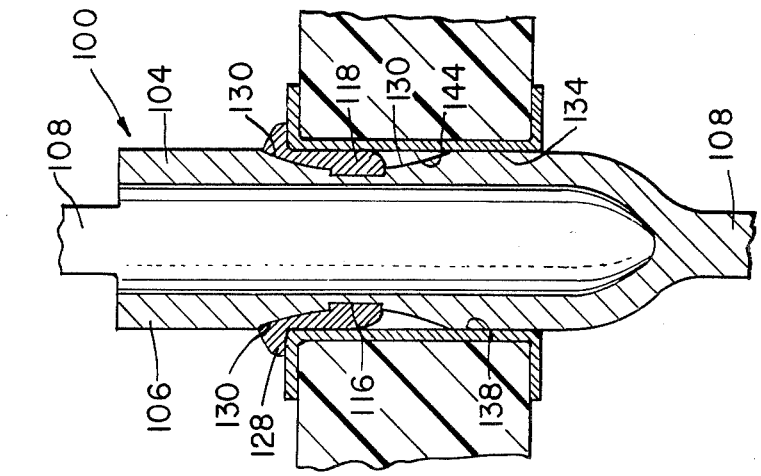
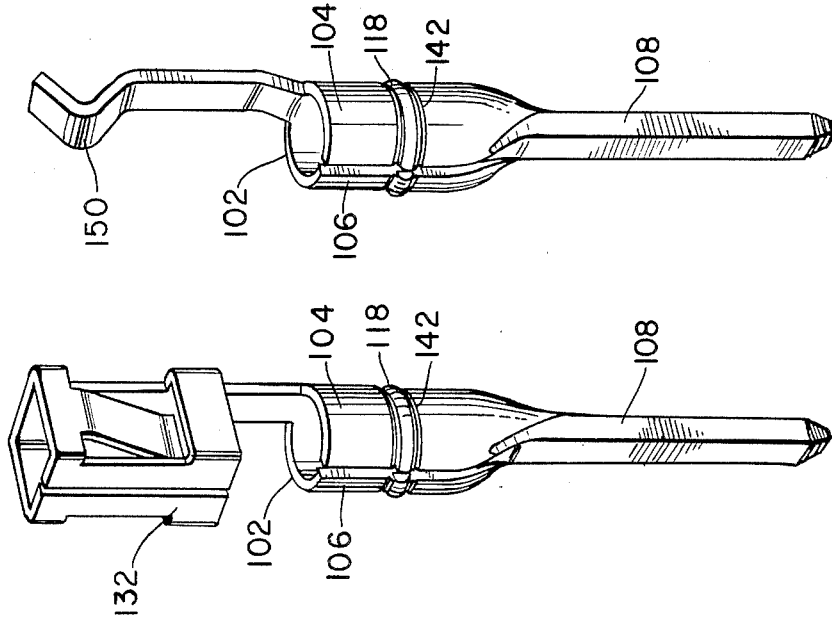
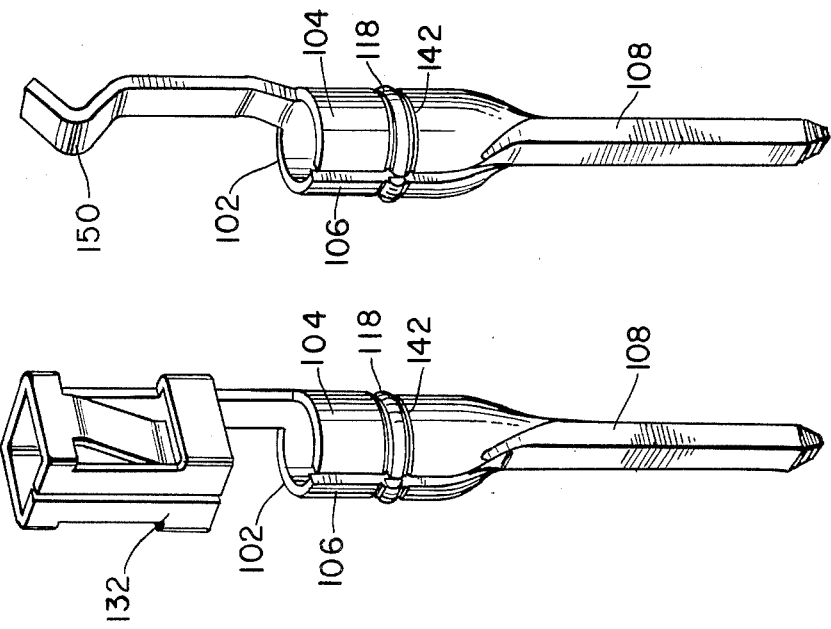

SOLDERABLE ELECTRICAL CONTACT

This is a continuation of application Ser. No. 248,800, filed Mar. 30, 1981, now abandoned.

BACKGROUND OF THE INVENTION

This invention relates generally to the field of solderable electrical connectors, and more specifically to a component and method used for making electrical connections to a printed circuit (PC) board or the like.

Various devices are available in the prior art to establish a mechanical and electrical connection between two current-carrying elements. The majority of these connectors involve the mating of male and female component members. In one category of such connectors a spring-loaded or resilient surface on one of the members is placed into contact with a cooperatively shaped surface on the other member. The resiliency then holds the two members together in electrical contact until a separating force is applied to the connector which is sufficient to overcome the retaining tension.

While these resiliently mating connectors provide a convenient device for rapidly making or interrupting electrical connection between two current-carrying members, the resulting connection may not be reliable enough for permanent use in some instances. It is therefore frequently desirable to solder the connection to prevent mechanical separation of the connecting members and to improve the conductivity of the electrical junction. This is especially true in the case of PC board connections, in which the electrical and mechanical quality of the connections must be assured for reliable operation.

Techniques for providing such soldered connections are known in the art, by which a quantity of solder is melted adjacent the junction of two members so that the solder flows, by gravity or capillary action, over the adjacent or abutting surfaces of the members to be soldered. However, when the members to be soldered are closely mating elements, a problem is frequently encountered because of the difficulty of assuring solder flow into the region where the mating members meet.

An example of this occurs in the so-called "Tri-socket" connector for making connection to a through-plated hole on a PC board. This connector, for example, may have a socket at one end for establishing an electrical connection with a pin of a dual in-line (DIP) package when inserted into the socket end of the connector, and a wire wrap post at the other end of the connector around which may be wrapped a wire from an external circuit. This connector also has a resilient tricornered fin arrangement in the middle of the connector, which upon insertion into a plated hole of a PC board is compressed resiliently against the wall of the hole. A rivet of solder is carried by the connector above the resilient arrangement, the rivet resting above the PC board when the resilient arrangement is within the PC board hole. The connector is then soldered in place by heating, as in a heating chamber, which allows the solder rivet to melt and flow into the hole to bond the fin arrangement to the plated hole.

Soldered connections formed with contact elements such as this Tri-socket connector may have mechanical or electrical flaws if the soldering process is not carefully monitored. Since the solder is initially located outside the hole in the PC board before being heated, the soldering process must be planned so that melting solder will flow properly into the hole and then adhere well to both the plating surrounding the hole and the prongs of the contact element. However the flow pattern of the melting solder may be affected by a number of variables, such as the temperature of the solder and the mating members, the angle at which the members are soldered, the shapes of the mating members, and the shape of the path over which the melted solder will run. The resulting unpredictability of this flow pattern may produce mechanical and electrical inconsistencies in the soldered connections which are not apparent from visual inspection. Thus, if the board and connector are not accurately aligned during heating to allow the solder to flow properly into the hole, the resulting connection may be mechanically weak because insufficient solder may reach the connecting region. If solder flows before the mating elements have been heated to the proper temperature, the resulting junction may be electrically poor due to the formation of a "cold joint". Even if the solder flows properly into the hole and adheres well to both connecting members, it may not get close to the region where the surfaces of the mating members are in contact. If the solder could be reliably introduced to this region the electrical junction would be improved and the resulting bond would be considerably strengthened, as it would provide a very thin layer of solder between two substantially conforming surfaces.

OBJECTS OF THE INVENTION

Broadly, it is an object of this invention to provide a connector or contact element and method for improving the quality and reliability of soldered electrical connections.

It is also an object to provide such a component and method which is readily adapted for use in establishing printed circuit board connections, and which may be used in assembly-line operations with mass soldering techniques while avoiding disadvantages present in connectors of the Tri-socket type.

It is yet another object to provide a contact element for making an improved soldered electrical connection, which contact element can be manufactured from a flat metal strip by very simple and efficient stamping steps in multiple-stamping apparatus.

It is still another object to provide a method for manufacturing improved solderable contact elements from a flat metal strip by very simple and efficient stamping steps.

SUMMARY OF THE INVENTION

In accordance with an illustrative embodiment of the present invention, a structure and method are provided for making a soldered electrical connection between two mating members, in which a deposit of solder on the surface of one of the members is juxtaposed to a cooperatively shaped surface on the other member when the two members are mated, so that the solder is in position to melt and bind the two surfaces when heated, with minimum flow of solder. The quality of this connection may be further improved by providing a resilient arrangement for urging the conforming surfaces together as heat is applied.

In one form of contact element embodying the invention a hollow, cylindrical metal shell or sleeve with a longitudinal split provides a resilient fit into a mating member, such as a metal-lined or tinned hole on a printed circuit board. The shell is provided with a deposit of solder on its outer surface where the shell is to engage the metal lining of the hole. The problem of providing a flow of solder into the hole is therefore eliminated, since the deposit of solder is pre-positioned inside the hole upon mating of the members. Furthermore, the placement of solder directly between the surfaces to be bonded reduces the possibility that the solder will melt before the surfaces have been sufficiently heated, thus minimizing the likelihood of forming a "cold joint".

When heat is applied at the location of the desired connection, the resilient action of the shell pushes the melting solder on its surface against the metal lining of the hole, and fills in any gaps which might otherwise form as the solder disperses. The application of pressure between the shell and hole lining during soldering further assures a good electrical connection between the mating surfaces which is maintained upon solidification of the solder.

DESCRIPTION OF DRAWINGS

For a better understanding of the invention, reference should be made to the following description taken together with the accompanying drawings, in which:

FIG. 9 is a side elevational view of a second embodiment of a contact element;

FIG. 10 is a cross-sectional view of the contact element of FIG. 9 taken through section 10—10, shown in position for soldering in a metal-lined hole of a PC board, shown in section;

FIGS. 11 and 12 are perspective views of a contact element as in FIG. 1, but with a box-type socket terminal at one end in FIG. 11 and a cantilever spring contact in FIG. 12.

DESCRIPTION OF THE PREFERRED EMBODIMENT

Figure 1:
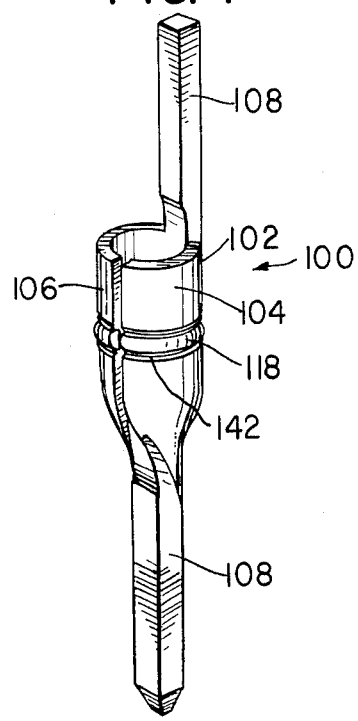
FIG. 1 is a perspective view of a contact element constituting one form of the invention.
Figure 2:
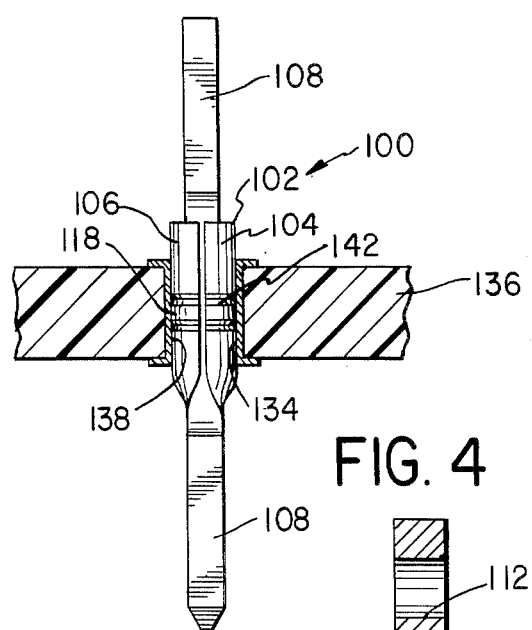
FIG. 2 is a front elevational view of the contact element of FIG. 1, shown in position for soldering in a metal-lined hole of a PC board which is illustrated in cross-section.

Referring now to the details of the drawing, FIG. 1 is a perspective view of a contact element or connector 100 incorporating the invention. The contact element of FIG. 1 broadly comprises a male contact having a body 102, such as a sleeve or shell proportioned and shaped for mating connection with a corresponding female contact such as a metal-lined aperture 134 (which may be solder-coated) on a PC board 136 as illustrated in FIG. 2. The male contact 102 has an engaging surface 104 on its outside, which substantially conforms to a portion of the inside surface 138 on the female contact 134 when the two contacts are mated. The resiliency of the sleeve or shell 102 serves to urge the two surfaces 104 and 138 together, when the shell 102 is inserted in hole 134. A deposit of solder 118 is positioned on the shell surface 104 so as to be pressed against the portion of the inside surface 138 of the female contact 134 which conforms to the male contact engaging surface 104, when the contacts 102 and 134 are assembled. The solder 118 preferably projects slightly, as by a few thousandths of an inch, beyond the surface of the body 102. The contact element 100 may further include one or more terminal portions affixed to or integral with it, such as wire wrap posts 108 or other terminals, for simplifying electrical connection from the contact element 100 to other electrical apparatus. It will be understood that any desired terminals may be used in place of the wire wrap posts 108, such as box socket contacts, or spring contacts or sockets, or contact pins, or the like.

In assembly, the contact element 100 of FIG. 1 is first mated with the corresponding female contact 134 by inserting male contact 102 to a depth at which the solder deposit 118 on the engaging surface 104 is inside the female contact 134 and in contact with its inside surface 138. This causes the deposit of solder to rub against and be pressed between the inside surface 138 and the engaging surface 104 prior to soldering due to the resiliency of the shell 102.

After the contacts 102 and 134 have been mated they may be heated by any of various heating methods known in the art, thus causing the solder 118 to melt. As the solder 118 melts and flows between the surfaces 104 and 138 to be bonded, the resiliency of the shell 102 causes its engaging surface 104 to expand outwardly and occupy the space left by the dispersing solder 118. This creates good contact between the members 102 and 134, and results in a highly reliable soldered junction.

In the case of PC boards, a number of contact elements may be simultaneously soldered to the board by a batch method of heating. Such heating may be performed on many printed circuit boards together by placing the boards on a conveyor which carries them into a heating chamber. The elements may then be heated by hot air or vapor within the chamber, to a temperature which exceeds the melting point of solder. After allowing sufficient time for the solder to melt and flow, the conveyor may carry the boards out of the chamber, while simultaneously bringing in a batch of new boards to repeat the soldering process. The invention may therefore be used to provide a large number of reliable soldered connections in a cost-efficient, high-volume production process.

The embodiment of contact element 100 illustrated in FIG. 1 is especially well suited for mass production in a progressive or multiple stamping operation, thus permitting the invention to be produced with substantial savings in cost over other production methods. The contact elements of the invention may be made from a continuous strip of metal which may be initiall partially formed in a continuous operation and thereafter progressively formed in incremental steps by a number of stamping and bending operations to produce the finished product.

Figure 3:
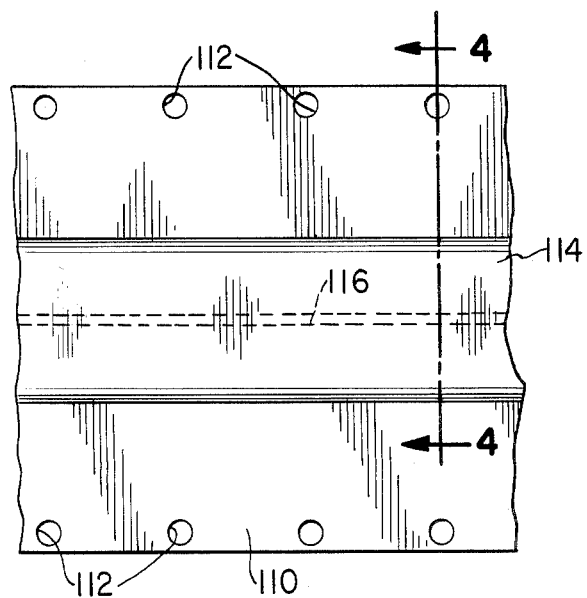
FIG. 3 is a front elevational view of a strip of metal useful in forming the contact element of FIG. 1.
Figure 4:
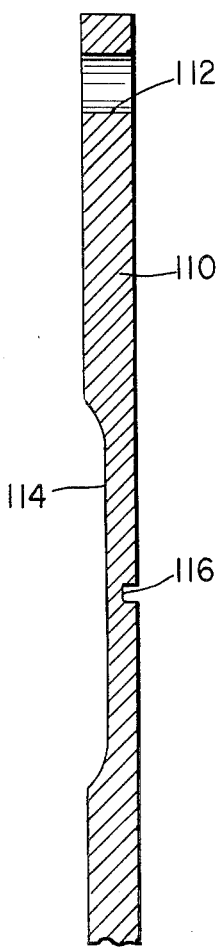
FIG. 4 is a transverse cross-sectional view of the metal strip in FIG. 3, taken through section 4—4.

FIGS. 3 and 4 are elevational and cross-sectional views of such a continuous metal strip 110, which in the illustrative embodiment described above may have a thickness determined by the preferred dimension of the wire wrap terminal posts 108. The metal strip is provided with a series of pilot holes 112 near each edge, which assist in advancing and assuring proper positioning of the strip 110 as it proceeds from one forming step to the next in the progressive stamping operation. A central slot 114 may be milled out of the strip 110 in order to reduce the thickness of the portion of the metal which will later be formed into the body of the contact element, when such reduction is desired. A groove 116 may be cut out of the strip, as by skiving, to provide a recess for a deposit of solder. The pilot-hole-forming, milling and skiving operations may be performed continuously as the strip passes from one reel to another. Alternatively the pilot holes may be formed in a progressive step-wise stamping operation.

Figure 5:
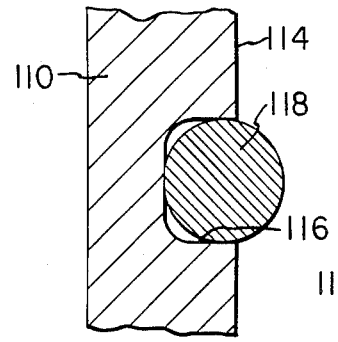
FIGS. 5 and 5A are a transverse cross-sectional views as in FIG. 4, of the metal strip at a later stage of fabrication, showing in FIG. 5 a filament of solder laid in place in a groove of the metal strip and in FIG. 5A the same filament pressed into and filling the groove.
Figure 5A:
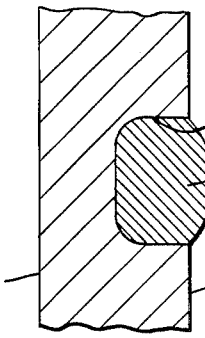

As illustrated in FIG. 5, a filament of solder 118 is placed in the groove 116 of the metal strip 110. This may be done continuously, following the forming of groove 116, by feeding the solder filament continuously from a reel and laying it into groove 116 as the metal strip passes. The solder filament 118 preferably has a diameter substantially fitting the width of groove 116 as shown in FIG. 5. By pressing the filament into the groove, the solder metal will flow to fill the corners of the groove as shown in FIG. 5A. The solder thus fills the groove, and may have a slight excess bulge, as shown. It will be appreciated that the term "filament" indicates a strip of solder with any desired cross-sectional shape and size, including a flat ribbon, or a round or rectangular wire, or any other suitable configuration.

Figure 6:
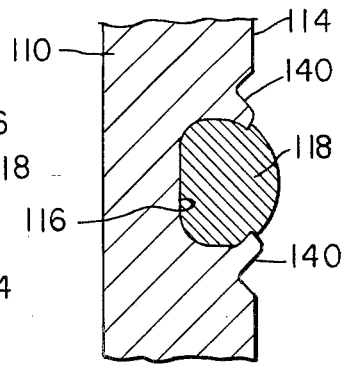
FIG. 6 depicts the strip of FIG. 5 at a still later stage of fabrication after the strip has been deformed on either side of the groove to retain the solder.

After the solder filament 118 is laid and pressed into groove 116, the sides of the groove 116 may be staked or peened as shown at 140 in FIG. 6 to hold the solder filament in place. Alternatively, the same result could be achieved by forming the groove in the metal strip to have side walls slanting inwardly in the same manner as the staked groove of FIG. 6. The filament of solder may then be pressed into the groove, taking advantage of the malleability of the solder to cause it to flow into the corners of the groove, to be retained by the undercut of the groove. The solder may be positioned in the groove in many other ways, as may be desired, including applying it as a molten metal, to harden in the groove.

Figure 7:
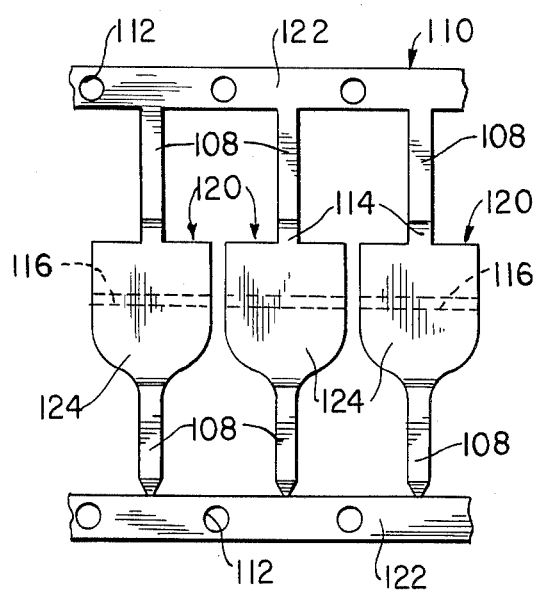
FIG. 7 is a front elevational view of the metal strip of FIG. 6 at a subsequent stage after waste sections have been removed, leaving metal blanks which may be formed into contact elements attached to carrier strips.
Figure 8:
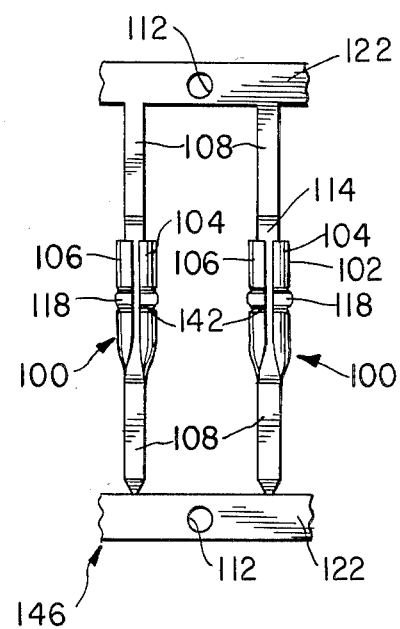
FIG. 8 is a front elevational view of the metal strip of FIG. 7 after forming the metal blanks into contact elements.

After the metal strip 110 has been combined with solder 118 according to the steps described above, it may be stamped and formed to produce the contact element shown in FIG. 1. FIGS. 7 and 8 show progressive stages through which the strip may pass. As shown in FIG. 7, waste sections are removed, which then leaves metal blanks 120 attached to continuous carrier strips 122 at the top and bottom of the original strip. Where desired, only a single carrier strip may be formed. Each metal blank 120 comprises a flat contact body portion 124 and two terminal portions, illustratively wire-wrap posts 108 as seen in FIG. 7. The carrier strips 122 with the pilot holes 112 may then draw the metal blanks through an incremental series of forming steps, as is well-known in the art, to bend each connector body portion 124 about a longitudinal axis (vertical in the figure) to form a series of radially or laterally resilient, split, hollow shells or sleeves 102 as shown in FIG. 8, with carrier strips 122 attached. The solder filament 118 carried on shell 102 then forms a ring 142 about the shell 102, about at its center, which may project slightly radially outward from the shell 102. When such a contact element 100 is mated with a female contact 134, such as a plated hole in a PC board (as shown in FIG. 2), the sleeve 102 is positioned so as to place the ring 142 against the inside surface 138 of hole 134, preferably near the central portion 144 of that inside surface 138. When heated, the solder 118 will then disperse to either side of the central portion 144, coating with solder substantially the entire inside surface 138 juxtaposed to the outside surface of shell 102. This positioning is especially preferred when the walls of the female contact member are convex in transverse section, as in a metal eyelet. In this case the ring of solder 142 should desirably be positioned against the apex of the convexity of the wall, in order to assure pressure on the solder ring as it melts and to promote dispersion of the solder 118 to either side of the apex for maximum bonding strength.

The carrier strips 122 may serve an added function when a group of contact elements 100 are to be inserted together into a corresponding group of mating members having a predetermined spatial relationship. This may be illustrated with reference to a PC board assembly having a number of input or output terminals spaced along a side of the board, each terminal comprising a female contact such as metal-lined hole 134. The holes 134 in this assembly may be sequentially spaced apart from each other at a uniform distance which corresponds to the distance between two contact elements 100 on a carrier strip 122. Another assembly 146 comprising an equal number of male contact elements 100 on carrier strips 122 as in FIG. 8 may be prepared for insertion by detaching one of the two carrier strips 122. This assembly 146 of contact elements 100 may then be positioned in mating alignment with the correspondingly spaced terminals 134 and concurrently mated as described earlier with relation to a single contact element 100. The remaining carrier strip 122 may then be detached and the group of connections soldered simultaneously in a batch heating process, as described earlier.

FIG. 9 is a side elevational view of an alternate embodiment of the contact element 100 of FIGS. 1-8. This embodiment incorporates a ridge 126 around the circumference of the solder ring 142, which provides a visible indication of the state of the solder 118 after the contact element 100 has been mated with a female contact 134 as shown in FIG. 10. The malleability of the solder permits the ridge portion 126 to be spread along the mating surfaces 104 and 138 as the contacts 102 and 134 are mated, extending some solder above the female contact 134, so that a rim of solder 128 will be visible around the circumference of the male contact 102 where it emerges from the female contact 134. After the contacts 102 and 134 have been heated, this rim of solder 128 permits visual inspection of the soldered connection to tell whether the contacts 102 and 134 have been sufficiently heated to melt the main deposit of solder 118 which is hidden from view within the soldered junction.

Longitudinal channels 130 may further be formed in the surface of the shell 102 perpendicular to the groove 116 (vertically in the drawing) and opening into it to permit a connection between the groove 116 and solder from the rim 128 in the event that part of the solder rim 128 is sheared away from the filament of solder 118 when the contact element 100 is inserted into a mating member. The portions of the ridge 126 which are adjacent to the channels 130 would be pushed into the channels 130 and maintain contact with the rim 128 as the members are mated, as shown in FIG. 10. Thus a sheared solder rim 128, which might otherwise be dislodged and create a shortcircuit, would remain in place prior to heating.

It should be noted that the contact element 100 shown in FIG. 9 may require a slightly different depth of insertion than the embodiment shown in FIG. 1, when mated with a female contact 134 as shown in FIG. 10. If the female contact is relatively deep, such as 3/16 of an inch, positioning of the solder filament 118 near the central portion 144 of the inside surface 138 may increase the likelihood of undesirable dislodging of part of the rim of solder 128. In this instance the optimum insertion depth for the solder filament 118 may be above rather than at the central portion 144, as shown in FIG. 10.

FIG. 11 illustrates an embodiment of the contact element 100 of the present invention, with a box socket terminal 132 in place of the wire wrap post terminal 108 shown in FIGS. 1-10. FIG. 12 shows another embodiment substituting a terminal in the form of a cantilever or spring-finger contact 150. It will be understood that many other techniques known in the art for providing electrical connection between a contact element and an electrical apparatus may be used in place of the wire post or box socket or spring-finger terminals shown. Furthermore, the contact element of the invention may be made integral with another electrical device, such as a terminal of a transistor or DIP, to provide connection of the device directly to a PC board or to another electrical device.

While the resiliency of the contact element 100 depicted in the drawings is provided by a resilient metal shell or sleeve 102 with a longitudinal split which permits circumferential compression, the invention may be practiced with other types of resilient elements. For example, a spring or an elastic plug could be placed between two halves of a metal shell so as to urge them apart from each other. It will therefore be understood that the resilient element need not be integrated into the body of either mating member, but may be a distinct element which is mechanically linked to the mating surfaces.

For purposes of illustration, the contact element of the preferred embodiment is shown and described with a male contact at 102 which has a deposit of solder 118 on its engaging surface 104. It should be understood that the inventive features of this device may also be included in a female contact element, having a deposit of solder on its inner surface. For example the split hollow shell 102 described above could be used as a female contact, and the ring of solder 142 could be positioned in a groove on its inside surface. In this case, a male contact such as a plug or pin with a metallic outer surface could be inserted into the female contact to a depth at which the ring of solder on the inside of the female contact is positioned between the metal outer surface of the plug and the inner surface of the female contact. The resiliency of the female contact in this case would press the deposit of solder against the metal surface of the male contact when the two contacts are mated. Either the male or the female contact element could also be provided with appropriate terminal portions for connection to other electrical apparatus.

The present invention may also be practiced with a connector arrangement having male and female mating members in which the deposit of solder is positioned on one member, and the other member provides the resiliency which presses the two mating surfaces together. An example of this would be a connector arrangement in which the female mating member is a split metal ring and the male mating member is a cylindrical metal plug or pin with a deposit of solder on its surface, preferably in a groove formed thereon. The metal plug could then be inserted into the split ring so that the deposit of solder is between the surfaces of the plug and the ring. It will be appreciated that this combination would then include the advantages of the novel features described above.

As used in the specification and claims to describe the split hollow shell of the present contact element, the term laterally resilient is defined relative to a longitudinal axis along which the male contact travels when it is being inserted into a female contact. Since the contact element of the invention may include either a male contact or a female contact, it will be appreciated that the lateral resiliency of a male contact element exerts an outwardly expansive force toward the wall of the female contact, whereas the lateral resiliency of a female contact element exerts an inwardly compressive force toward the outer surface of a male contact.

It will also be appreciated that a contact element according to the present invention need not have a circular cross-section, but the invention may be practiced with many other shapes such as triangular, oblong and irregular shapes. The term circumferential, therefore, with regard to a contact element of any cross-sectional shape, refers to the outer periphery of a male-type contact element or the inner periphery of a female contact element. Also it will be understood that, in any form of the invention, a stop may be formed on the device to determine its depth of insertion into a PC board or the like, to properly juxtapose the solder ring with the metal-lined hole or eyelet.

Many other additions, modifications or substitutions may be made to the preferred forms of the invention disclosed in this specification, without departing from the scope and spirit of the invention as defined in the accompanying claims.

What is claimed is:

1. A contact element adapted to form one member of an electrical connection arrangement having mating male and female members, comprising:
   A body having an engaging surface conforming substantially to a corresponding surface on the mating member;
   said body having a peripheral groove communicating with said engaging surface;
   a deposit of solder in said groove, said solder including a peripheral ridge portion projecting away from the groove and extending beyond said engaging surface, said ridge portion being adapted to be at least partially displaced from the remaining solder in said groove upon mating of said members;
   whereby, upon mating of said members, at least a portion of said ridge of solder is externally visible at the juncture of said mated members;
   said contact member further including at least one longitudinal channel communicating with and substantially perpendicular to said groove.

2. A solderable connector arrangement for establishing an electrical connection, comprising:
   a male member having a body with an outer surface and a female member having a body with an inner surface, said outer and inner surface conforming substantially to each other when said male and female members are mated;

at least one of said members having a peripheral groove communicating with its respective surface;

a deposit of solder in said groove, said solder including a peripheral ridge portion projecting away from the groove and extending beyond the respective surface, said ridge portion being adapted to be at least partially displaced from the solder in the said groove upon mating of said members;

whereby, upon mating of said members, at least a portion of said ridge of solder is externally visible at the juncture of said mated members;

at least one of said members further including at least one longitudinal channel disposed to be in communication with and substantially perpendicular to said groove.

* * * * *